United States Patent
Yu

(10) Patent No.: US 6,605,541 B1
(45) Date of Patent: Aug. 12, 2003

(54) PITCH REDUCTION USING A SET OF OFFSET MASKS

(75) Inventor: Allen S. Yu, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 632 days.

(21) Appl. No.: 09/074,292

(22) Filed: May 7, 1998

(51) Int. Cl.[7] .............................................. H01L 21/311

(52) U.S. Cl. ........................ 438/700; 438/706; 438/717; 438/725

(58) Field of Search ................................ 438/734, 735, 438/738, 700, 706, 736, 702

(56) References Cited

U.S. PATENT DOCUMENTS

| | | | | |
|---|---|---|---|---|
| 4,414,057 A | * | 11/1983 | Bourassa et al. | 438/738 |
| 4,484,978 A | * | 11/1984 | Keyser | 438/734 |
| 5,201,993 A | * | 4/1993 | Langley | 438/738 |
| 5,346,586 A | * | 9/1994 | Keller | 438/738 |
| 5,444,020 A | * | 8/1995 | Lee et al. | 438/734 |

* cited by examiner

*Primary Examiner*—Benjamin L. Utech
*Assistant Examiner*—Duy-Vu Deo

(57) ABSTRACT

A method of manufacturing a semiconductor device having features with a dimension of ½ the minimum pitch wherein the minimum pitch is determined by the parameters of the manufacturing process being used to manufacture the semiconductor device. A target layer of material to be etched with dimensions of ½ the minimum pitch is first etched with masks having a dimension of the minimum pitch and the target layer of material is then etched with the masks offset by ½ the minimum pitch.

3 Claims, 7 Drawing Sheets

PITCH REDUCTION USING A SET OF OFFSET MASKS

BACKGROUND OF THE INVENTION

1. Field of the Invention

This invention relates generally to a method of manufacturing a high performance semiconductor device. More specifically, this invention relates to a method of manufacturing a high performance semiconductor device with features having a pitch of ½ the minimum pitch achievable in the manufacturing process being utilized. Even more specifically, this invention relates to a method of manufacturing a high performance semiconductor device with features having a pitch of ½ the minimum pitch achievable in the manufacturing process being utilized by using an offset mask with the minimum pitch.

2. Discussion of the Related Art

Industry and consumer demands for improved high performance products containing semiconductor devices are increasing at a high rate. The increased demands for improved high performance products are being met by improving performance of the electrical circuitry and by increasing the speed at which the semiconductor devices function. A result of increasing the performance of the increased electrical circuitry and increasing the speed is that it is necessary to manufacture more and more transistors into a fixed area of silicon. The performance of a semiconductor device, such as a microprocessor, is related to several factors, one of which is the width of the polysilicon gates of the FET transistors that are formed on the device.

In the leading state of the art process technologies, there have been attempts to reduce the final gate dimension and other feature dimensions. Some of these attempts include a process of over-exposing the photoresist mask and trimming the resist and hard masks. Some of the attempted methods have resulted in limited success, however, the methods are difficult to control and show varying results. However, these methods only reduce the main feature width while the overall spacing of the feature increases. Because the pitch of the device does not decrease, there is no gain in density. The ultimate limiting factor is that the parameters of a manufacturing process limit the achievable minimum pitch. Some of the limiting factors are the parameters of the lithographic system being used to manufacture the semiconductor device. For example, a limiting factor is the wavelength of the radiation utilized to illuminate the mask or reticle in order to transfer the pattern on the reticle to the wafer being manufactured. Another limiting factors of the lithographic system is the quality of the lens system that reduces the size of the pattern on the reticle to the size that is imaged onto the wafer. In order to improve the lithographic systems, various steps have been undertaken such as reducing the wavelength of the illuminating radiation. Currently, ultraviolet sources are used, however, the lens materials available that will efficiently transmit ultraviolet radiation are limited and those that are available are very expensive. Other radiation sources, such as x-ray sources have been proposed as well as electron-beam lithography systems. These alternative sources have the potential to further decrease the feature size of the resulting semiconductor device, however, the systems utilizing the x-ray or electron-beam sources have problems.

An example of the current technology utilizing a deep ultra violet (DUV) for the quarter micro process technology uses a source of radiation having a wavelength of 248 nanometers. To insure the printed minimum feature having an acceptable depth of focus, the printed feature is usually targeted slightly larger than the wavelength. In this case, the printed feature is targeted at 260 nanometers.

Therefore, what is needed is a method of manufacturing a semiconductor device. utilizing the currently available lithographic systems that can provide features substantially less than, for example, the targeted 260 nanometers when the illumination source has a wavelength of 248 nanometers.

SUMMARY OF THE INVENTION

According to the present invention, the foregoing and other advantages are attained by a method of manufacturing a semiconductor device that will have features with a dimension of ½ the minimum pitch that is determined by the parameters of the manufacturing process. In accordance with the present invention, a target layer of material that is to have dimensions of ½ the minimum pitch is formed on a partially completed semiconductor device. The target layer of material is subjected to a first etch process with masks having a dimension of the minimum pitch. The target layer of material is then subjected to a second etch process with the masks offset by a distance of ½ the minimum pitch.

The first etch process includes forming a hard mask layer on the target layer, etching the hard mask layer using a first photoresist pattern having dimensions of the minimum pitch which exposes portions of the target layer having dimensions of the minimum pitch. The first photoresist pattern is removed and the hard mask layer and the portions of the exposed target layer are etched using a second photoresist pattern having dimensions of the minimum pitch. The second photoresist is offset from the position of the first photoresist pattern by ½ the minimum pitch.

The second etch process includes removing the second photoresist layer, forming a film having a high etch selectivity with respect to the hard mask, removing the remaining portions of the hard mask layer which exposes the further portions of the target layer. The further portions of the target layer are etched resulting in the target layer having dimensions of ½ the minimum pitch.

The method of manufacturing of the present invention thus provides a method of obtaining a structure that has dimensions of ½ the minimum pitch achievable by a particular manufacturing process. The method of the present invention thus extends the usefulness of current manufacturing processes that have been limited by parameters of the manufacturing processes.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention, which illustrates the best mode presently contemplated by the inventor for practicing the invention.

Figure 1:
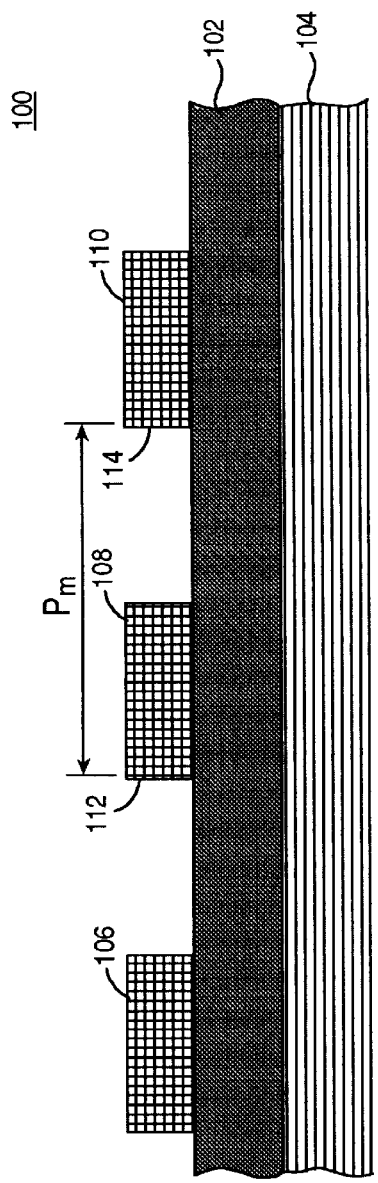
FIG. 1 shows the minimum pitch $P_m$ achievable in prior art manufacturing processes.

FIG. 1 shows a partially completed semiconductor device 100 with a layer 102. The layer 102 could be a layer such as an interlayer dielectric that is formed on a layer 104. The layer 104 could be a substrate layer or an active layer. As is known in the semiconductor manufacturing art, the previous active layer would have active elements such as transistors, which need to be connected to other transistors in that particular layer or to other active elements in a subsequent layer that will be formed on the semiconductor device. In order to connect active elements on the same layer, conductive elements called "interconnects" are used. In order to connect active elements on separate layers, conductive elements called "vias" are used to provide a conductive path from one layer to a subsequent layer. Because the number of active elements in a semiconductor device is increasing, the number of layers being manufactured is increasing with a concomitant increase in the number of interconnects and vias that are needed to provide the electrical connections necessary for the semiconductor device to function as designed. For the purpose of this discussion, the layer 102 is assumed to be an interlayer dielectric to isolate the previous active layer 104 from a subsequent layer (not shown). The active layer 104 would have numerous active elements, such as transistors that are not shown. For purposes of illustration, structures 106, 108 and 110 are shown and represent metal lines that serve to connect one active element to another. The term "pitch" defines the distance from an edge 112 on a first structure 108 to a corresponding edge 114 on adjacent structure 110. The minimum pitch, $P_m$, is determined by various processing parameters, such as the limits of the lithography system being used. Various factors within the lithography system, such as the wavelength of the illuminating radiation, the quality of the optic system and the quality of the reticules (masks) used, determine the minimum achievable distances between adjacent metal lines. Other considerations, such as electrical parameter, including a determination of the resistance of the metal lines and the parasitic capacitance between the metal lines, have to be accounted for in the design of the semiconductor device. As is known, the resistance of the metal lines would increase as the metal lines become smaller and the parasitic capacitance between adjacent metal lines would increase as the separation between the metal lines decreases. Therefore, the parameters of the specific manufacturing process being used determine the minimum pitch, $P_m$, achievable by the process.

Figure 2:
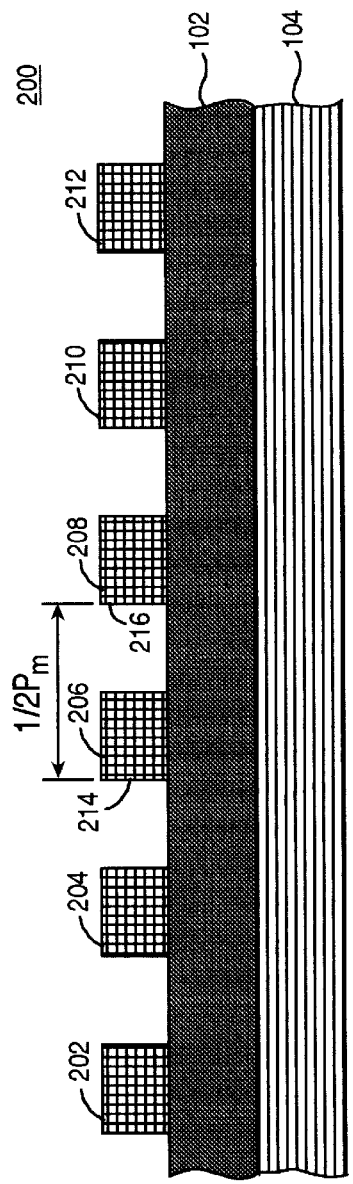
FIG. 2 shows ½ the minimum pitch $P_m$ achievable in accordance with the present invention.

FIG. 2 illustrates the pitch, ½ $P_m$ that is achievable in accordance with the present invention using the same manufacturing process to manufacture the semiconductor device 100 shown in FIG. 1. It should be appreciated that ½ the minimum pitch is achievable regardless of the manufacturing process being used. The methods of the present invention are process independent. In FIG. 2 and subsequent figures, like numerical designations are used to denote like structural components. FIG. 2 shows a semiconductor device 200 with layer 102 formed on layer 104 with metal lines 202, 204, 206, 208, 210, and 212. As can be seen, the number of metal lines can be doubled on the same surface area as that used in the prior art device. The minimum pitch, ½ $P_m$, is shown measured from surface 214 on metal line 206 to surface 216 on metal line 208.

FIGS. 3A–3K illustrate the manufacturing process in accordance with the present invention to achieve the ½ minimum pitch $P_m$.

Figure 3A:
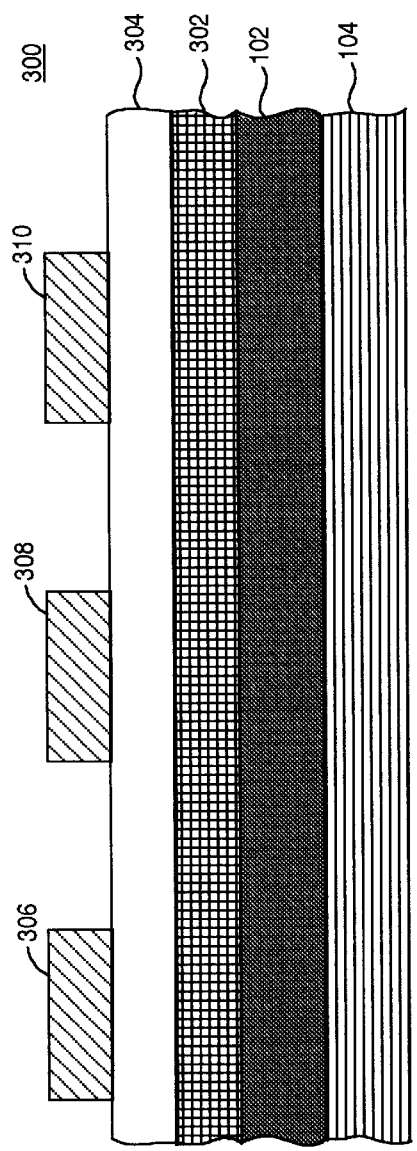
FIG. 3A shows the starting point for the method of the present invention on a partially completed semiconductor device and showing a substrate, the target film to be etched with features having ½ the minimum pitch, a layer of a hard mask material, and an etched photoresist layer forming a first etch mask on the layer of hard mask material.

FIG. 3A shows a partially completed semiconductor device 300 with a layer 102 that corresponds to the layer 102 shown in FIGS. 1 & 2 above and a layer 104 that corresponds to the layer 104 shown in FIGS. 1 & 2 above. The layer 102, if an interlayer dielectric, is typically $SiO_2$. A layer 302 of a conductive material that is going to be etched to form conductive lines is formed on the layer 102. The layer 302 of conductive material may be a highly doped polysilicon or a metal such as aluminum, titanium or copper. For example, if the layer 302 is to form gates for FETs (field effect transistors) the layer 302 would typically be highly doped polysilicon. If the layer 302 is to form conductive lines from one active area to another, the layer 302 would typically be a conductive metal such as titanium, aluminum or copper. It is not intended that the application be limited to the above materials. The layer 302 is to be etched with spacing defined by ½ the minimum pitch, $P_m$. A layer 304 of a "hard mask" material such as silicon nitride or titanium nitride is formed on the layer 302 of conductive material. Any well-known method of forming the layer 304 of hard mask material can be used. Portions 306, 308, and 310 of an etched layer of photoresist are formed on the layer 304. As is known in the semiconductor art, a layer of photoresist is formed on the surface of the semiconductor device and selected portions are etched away, leaving only portions of the photoresist that are to protect underlying portions of the device from a subsequent etch process.

Figure 3B:
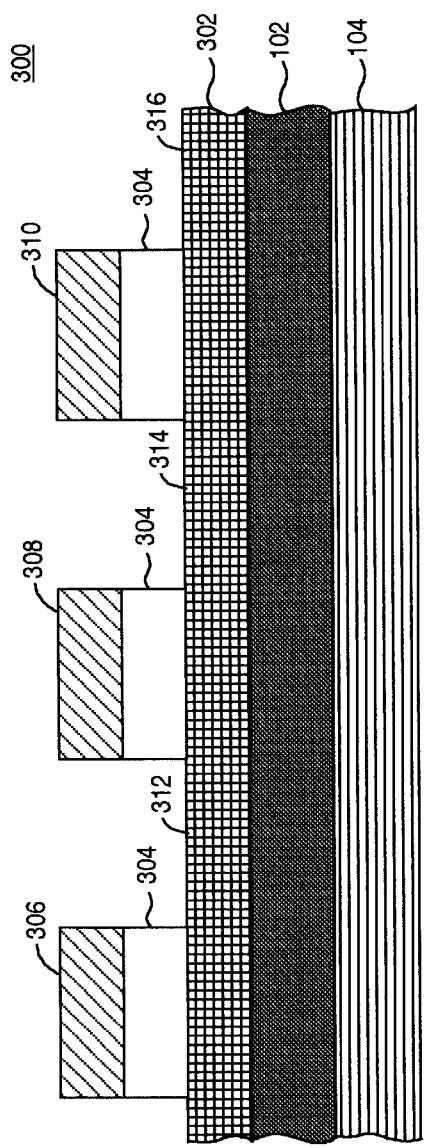
FIG. 3B shows the partially completed semiconductor device shown in FIG. 3A with the unmasked portions of the layer of hard mask material etched.

FIG. 3B shows the partially completed semiconductor device 300 shown in FIG. 3A with portions of the hard mask 304 removed by an etch process. Any well-known anisotropic etch process can be used to remove the hard mask 304 in line with the boundaries of the overlaying photoresist portions 306, 308, and 310. The selective etch process removes only the hard mask material and stops at the layer 302 of conductive material. The removal of portions of the layer of 304 hard mask material exposes selected portions 312, 314 & 316 of the surface of the layer 302 of conductive material.

Figure 3C:
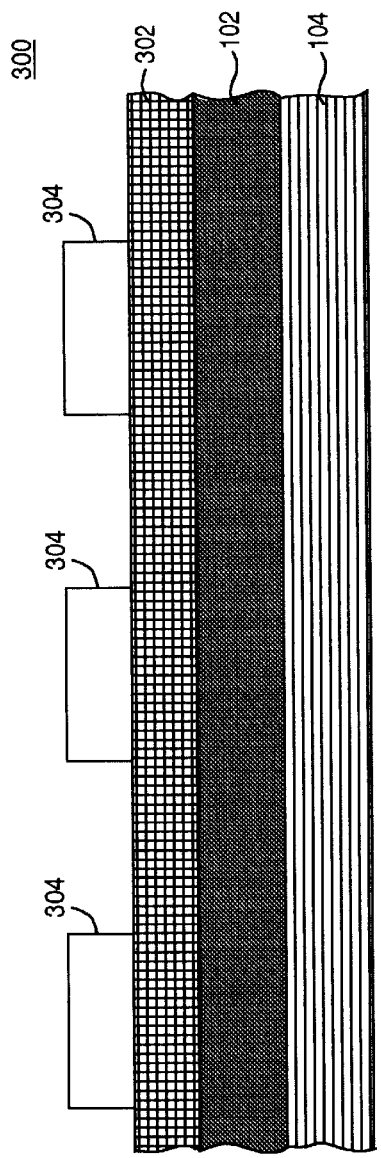
FIG. 3C shows the partially completed semiconductor device shown in FIG. 3B with the etch mask layer of photoresist removed.

FIG. 3C shows the partially completed semiconductor device 300 shown in FIG. 3B with the portions 306, 308, & 310 of the layer of photoresist removed.

Figure 3D:
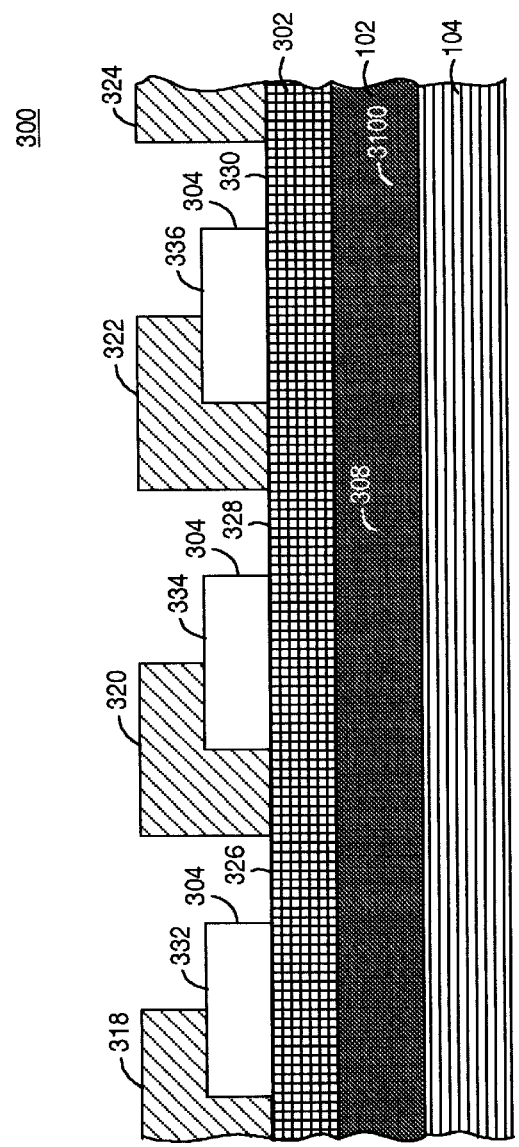
FIG. 3D shows the partially completed semiconductor device shown in FIG. 3C with a second etched photoresist layer forming a second etch mask on the surface of the semiconductor device.

FIG. 3D shows the partially completed semiconductor device 300 shown in FIG. 3C with portions 318, 320, 322 & 324 of a second photoresist layer having been formed on the semiconductor device 300. The second photoresist layer is offset so that the portions 318, 320, 322 & 324 are offset ½ its width from the position of the portions 306, 308, & 310 (FIGS. 3A & 3B) of the first photoresist layer. The second photoresist layer is etched so that the portions 326, 328 & 330 of the layer 302 of conductive material are exposed and so that the portions 332, 334 & 336 of the layer 304 are exposed.

Figure 3E:
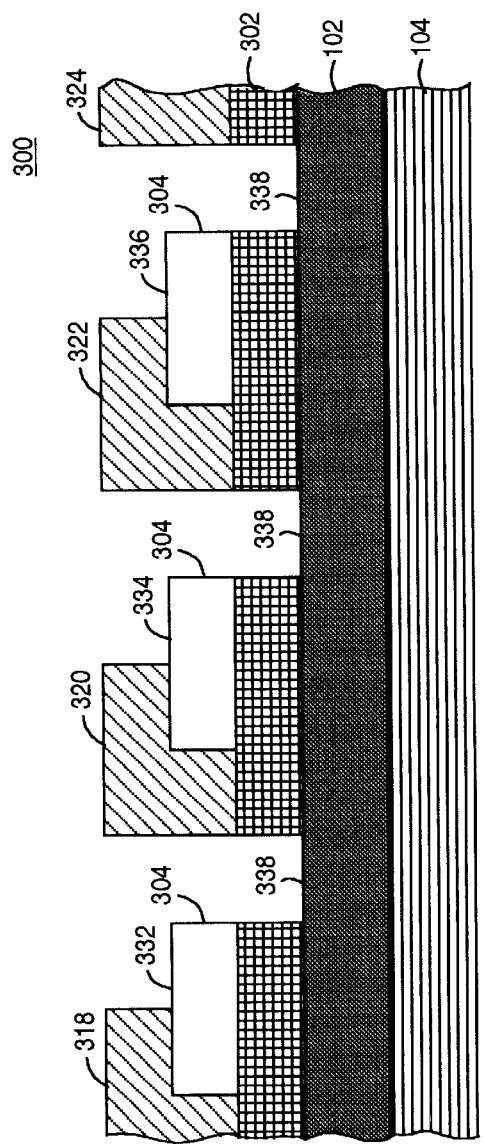
FIG. 3E shows the partially completed semiconductor device shown in FIG. 3D with the unmasked portions of the target film etched.

FIG. 3E shows the partially completed semiconductor device 300 shown in FIG. 3D with the conductive material underlying the exposed portions 326, 328 & 330 removed by an anisotropic etch process that selectively etches the material from which the layer 302 of conductive material is made. The anisotropic etch process selectively etches down to the surface 338 of the layer 102 of interlayer dielectric.

Figure 3F:
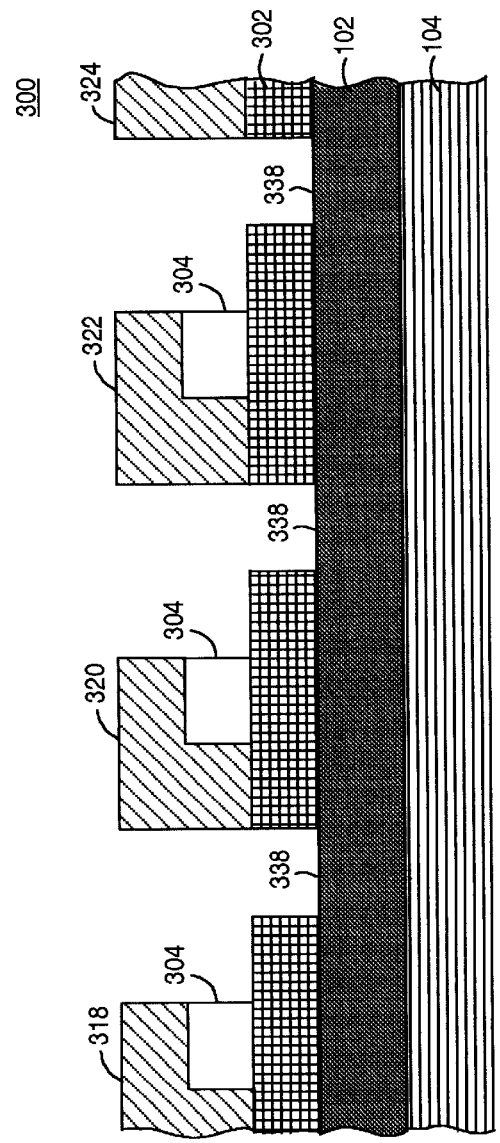
FIG. 3F shows the partially completed semiconductor device shown in FIG. 3E with the unmasked portions of the hard mask etched.

FIG. 3F shows the partially completed semiconductor device 300 shown in FIG. 3E after an anisotropic etch process that selectively etches the exposed portions 332, 334, & 336 of the layer 304 of the hard mask material. The anisotropic etch process etches layer 304 in line with the boundaries of the portions 318, 320 & 322 of the photoresist layer.

Figure 3G:
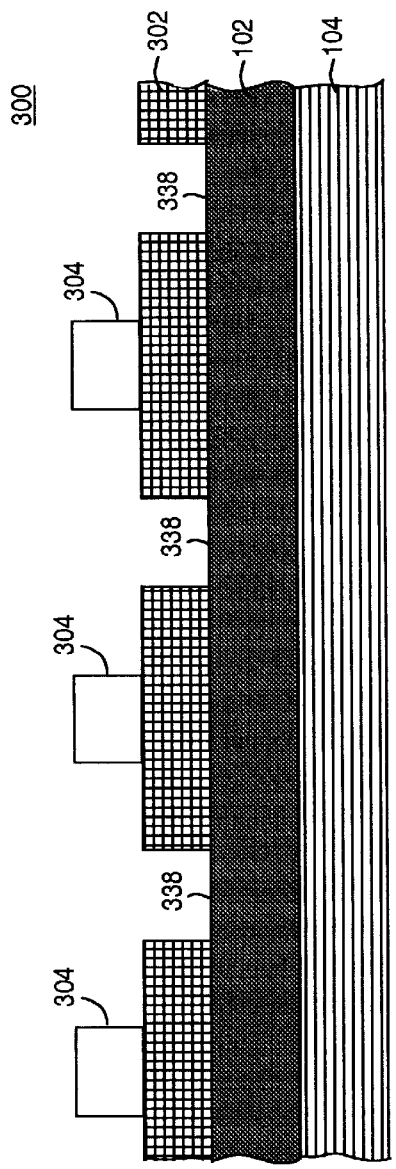
FIG. 3G shows the partially completed semiconductor device shown in FIG. 3F with the second mask removed.

FIG. 3G shows the partially completed semiconductor device 300 shown in FIG. 3F after portions 318, 320, 322 & 324 of the photoresist layer (FIG. 3F) have been removed.

Figure 3H:
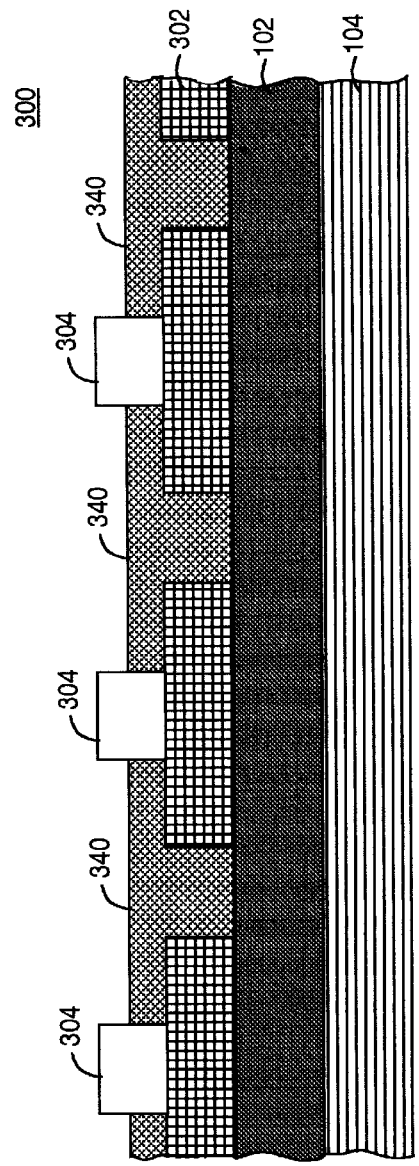
FIG. 3H shows the partially completed semiconductor device shown in FIG. 3G with a third photoresist layer forming a third mask on the semiconductor device leaving the portions of the remaining hard mask material exposed.

FIG. 3H shows the partially completed semiconductor device 300 shown in FIG. 3G after a film 340 has been formed on the surface of the semiconductor device 300. The film 340 has a high etch selectivity with respect to the layer 304 of hard mask material. The film 340 can be a material that can be deposited but is preferably a material that can be spun on. The spin-on process normally allows the surface of the film 340 to be planarized below the top surface of the remaining portions 304 of hard mask material leaving the top surface of the remaining portions 304 exposed. However, if the film 340 extends above the top surfaces of the remaining portions 304 of hard mask material, a blanket etch can be done to expose the top surface of the remaining portions 304 of hard mask material.

Figure 3I:
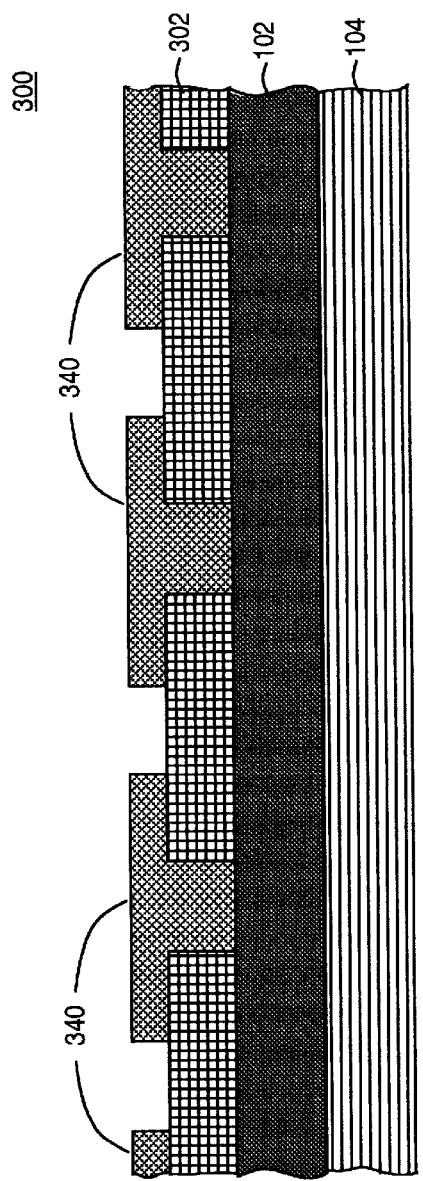
FIG. 3I shows the partially completed semiconductor device shown in FIG. 3H with remaining portions of the hard mask material removed.

FIG. 3I shows the partially completed semiconductor device 300 shown in FIG. 3H after the remaining portions of the layer 304 of hard mask have been removed by a selective etch process. The removal of the remaining portions of the layer 304 result in portions of the target layer 302 exposed. The film 340 is a self-aligned mask with respect to the target layer 302.

Figure 3J:
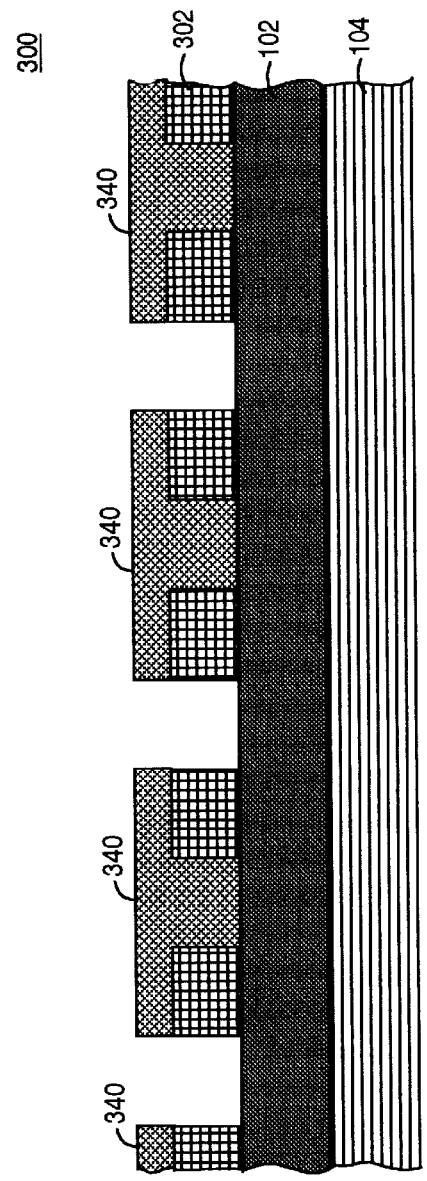
FIG. 3J shows the partially completed semiconductor device shown in FIG. 3I with the unmasked portions of the target film etched.

FIG. 3J shows the partially completed semiconductor device 300 shown in FIG. 3I after an etch process has been done to remove portions of the target film 302 exposed by the removal of the remaining portions of the layer 304 of hard mask material.

Figure 3K:
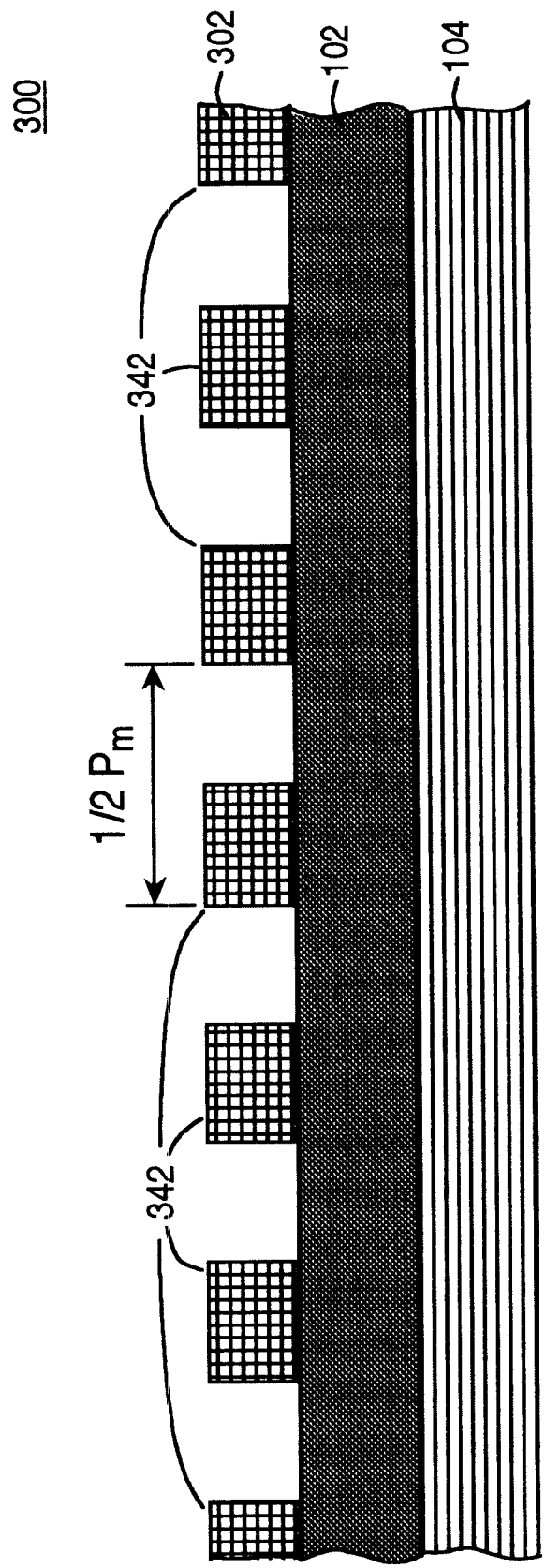
FIG. 3K shows the partially completed semiconductor device shown in FIG. 3J with the third mask material removed.

FIG. 3K shows the partially completed semiconductor device 300 shown in FIG. 3J with the remaining portions of the film 340 removed leaving portions 342 of the layer 302 of conductive material having a pitch of ½ $P_m$.

In summary, the results and advantages of the method of the present invention can now be more fully realized. The method of manufacturing semiconductor devices in accordance with the present invention provides a method of obtaining semiconductor structures having ½ the minimum pitch wherein the minimum pitch is determined by limitations inherent in the processes being used to manufacture the semiconductor devices. The present invention provides a method to extend the usefulness of current processes by obtaining semiconductor structures having ½ the minimum pitch.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device having features with a dimension of ½ the minimum pitch, wherein the method comprises:

forming a target layer of material on a partially completed semiconductor device, wherein the target layer of material is to be etched to a dimension of ½ the minimum pitch;

a first etch process of the target layer of material with masks having a dimension of the minimum pitch; and a second etch process of the target layer of material with the masks offset by a distance of ½ the minimum pitch.

2. The method of claim 1 wherein the first etch process comprises:

forming a hard mask layer on the target layer;

etching the hard mask layer using a first photoresist layer patterned with dimensions of the minimum pitch, wherein portions of the target layer having a dimension of the minimum pitch are exposed;

removing the first photoresist layer; and etching portions of the hard mask layer and portions of the exposed target layer using a second photoresist layer patterned with a dimension of the minimum pitch wherein the second photoresist layer is offset from the position of the first photoresist layer by a distance of ½ the minimum pitch, wherein the portions of the exposed target layer are etched with a dimension having ½ the minimum pitch.

3. The method of claim 2 wherein the second etch process comprises:

removing the second photoresist layer;

forming a film having a high etch selectivity with respect to the hard mask on the partially completed semiconductor device;

exposing remaining portions of the hard mask layer;

removing the remaining portions of the hard mask layer exposing further portions of the target layer;

etching the further portions of the target layer; and removing the film, wherein the target layer is etched with dimensions of ½ the minimum pitch.

* * * * *